United States Patent
Han et al.

(10) Patent No.: US 6,714,463 B2
(45) Date of Patent: Mar. 30, 2004

(54) SEMICONDUCTOR MEMORY DEVICE HAVING REDUCED CHIP SELECT OUTPUT TIME

(75) Inventors: Gong-Heum Han, Yongin-shi (KR); Choong-Keun Kwak, Kyunggi-do (KR); Kyeong-Yoon Bae, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/251,739

(22) Filed: Sep. 20, 2002

(65) Prior Publication Data
US 2003/0058696 A1 Mar. 27, 2003

(30) Foreign Application Priority Data
Sep. 24, 2001 (KR) .................................. 2001-59040

(51) Int. Cl.[7] .................................. G11C 7/00
(52) U.S. Cl. ................ 365/191; 365/233.5; 365/189.01
(58) Field of Search ............................ 365/191, 189.01, 365/193, 230.01, 233.5

(56) References Cited

U.S. PATENT DOCUMENTS 5,282,175 A * 1/1994 Fujita et al. ............ 365/230.06
5,764,573 A * 6/1998 Iketani et al. .......... 365/189.03

* cited by examiner

Primary Examiner—Thong Q. Le
(74) Attorney, Agent, or Firm—F. Chau & Associates, LLC

(57) ABSTRACT

A semiconductor memory device is provided to generate a series of pulse signals in response to the activation of an internal chip select signal from an internal chip select buffer when an external chip select signal transitions from an inactive state to an active state. With this configuration, a chip select output time (tco) is more reduced as compared to prior arts. Further, the chip select output time is reduced to be equal to an address access time ($t_{AA}$) because a designer can control the chip select output time. As a result, the whole access time of the semiconductor memory device can be reduced.

20 Claims, 16 Drawing Sheets

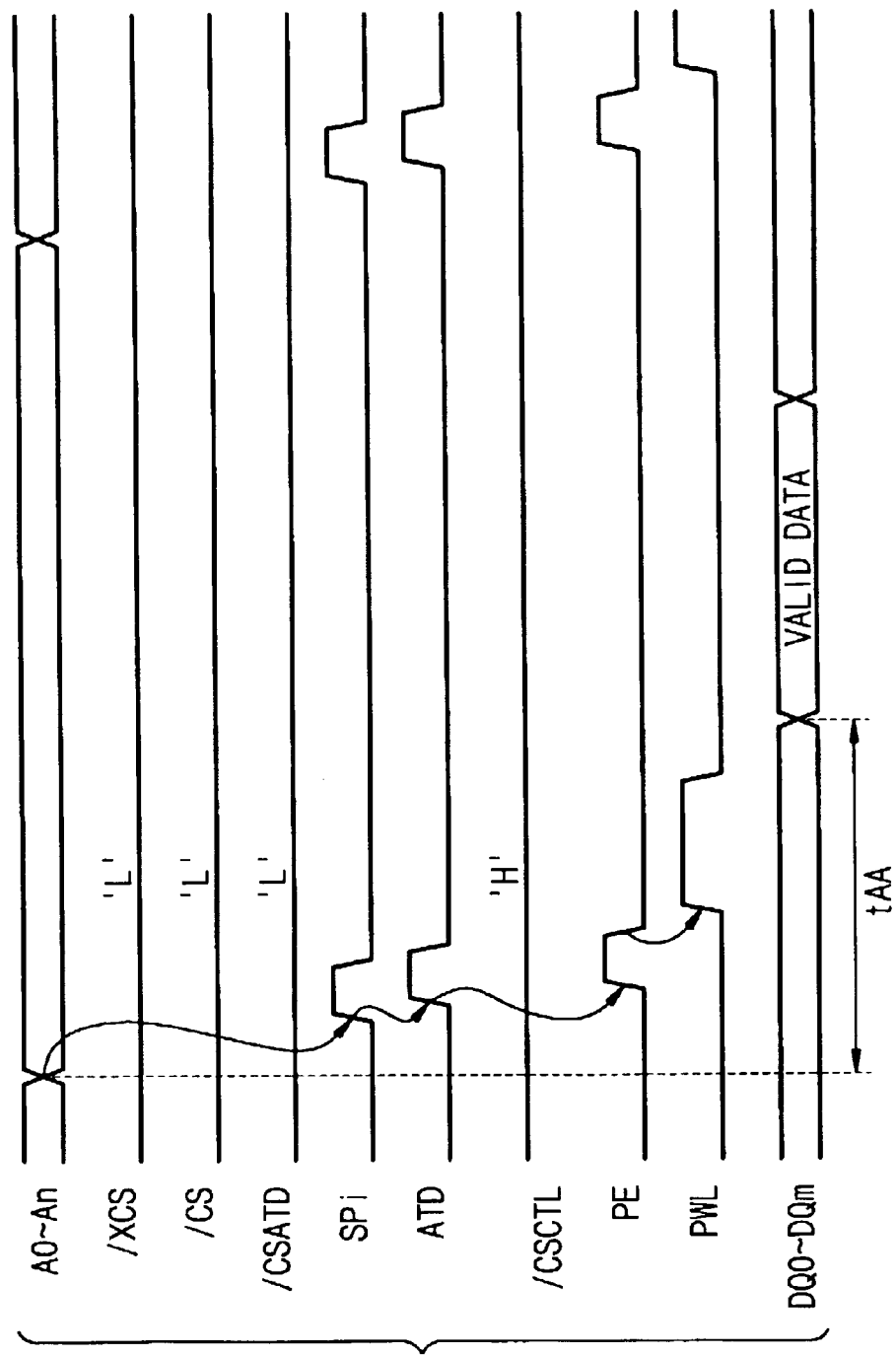

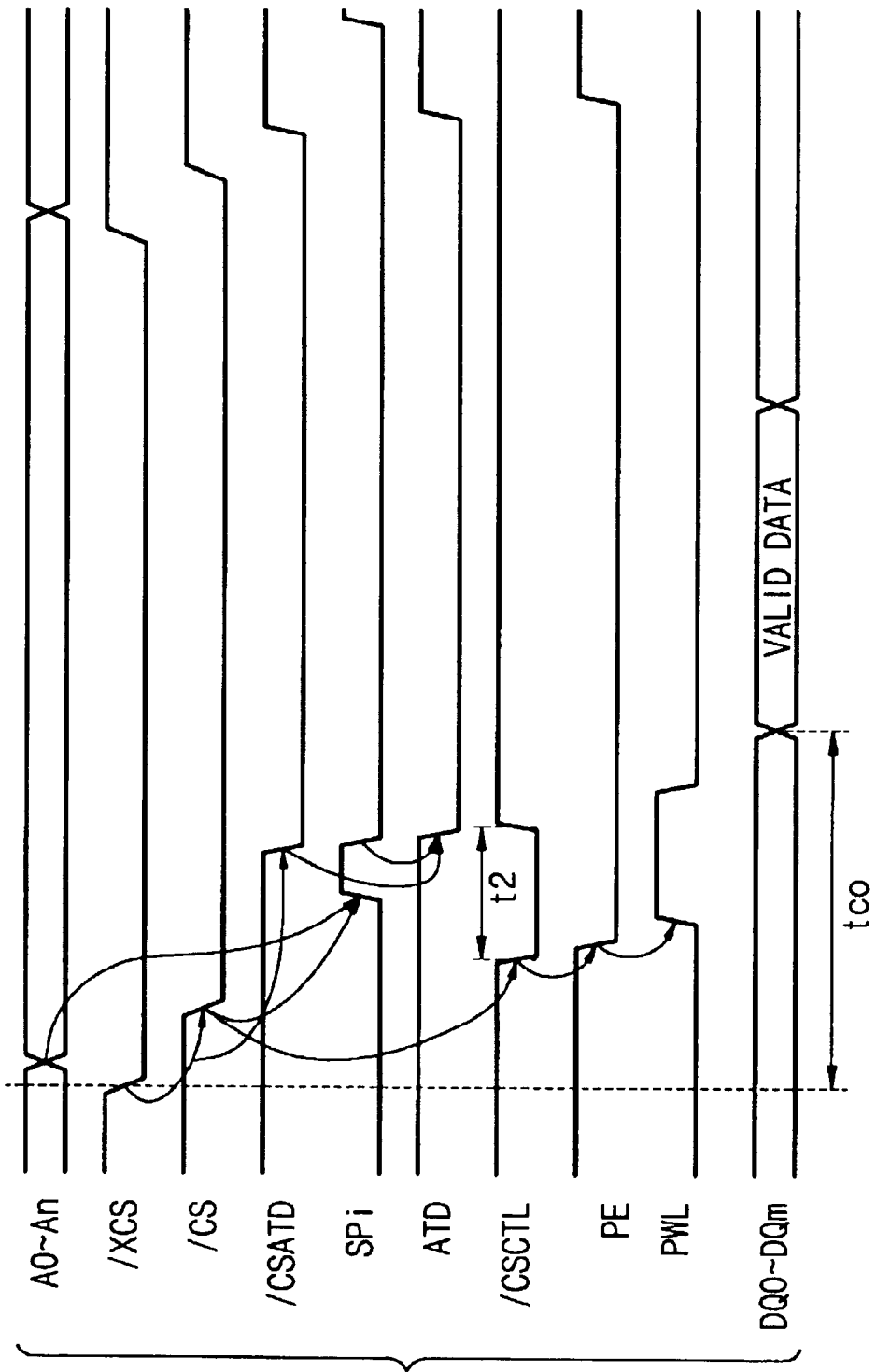

SEMICONDUCTOR MEMORY DEVICE HAVING REDUCED CHIP SELECT OUTPUT TIME

CROSS-REFERENCE TO RELATED APPLICATION

This application claims priority to Korean Patent Application No. 2001-59040, filed on Sep. 24, 2001, which is incorporated herein by reference in its entirety.

TECHNICAL FIELD OF THE INVENTION

The present invention relates to a semiconductor memory device, and more specifically, to a semiconductor memory device having a reduced chip select output time (tco) from the time when an externally inputted chip select signal transitions from an inactive state to an active state, to the time when valid data is loaded on a data bus.

BACKGROUND

In general, a static random access memory (SRAM) is controlled by an external chip select signal referred to herein as /XCS. When the external chip select signal /XCS is inactive, the SRAM is in a standby mode to hold data stored therein When the external chip select signal /XCS is active, the SRAM reads/writes data from/to a memory cell, which is assigned by an address. Further, signals for pre-charging bitlines of a memory cell, or equalizing or driving a sense amplifier, are also influenced by the external chip select signal /XCS. Only in a case where a chip select signal /CS is in an enable state where a row address signal or a column address signal transitions, are bitline pre-charge signals, or a sense amplifier equalizing and driving signal, generated to perform an abnormal write/read operation.

FIG. 1 schematically illustrates an architecture of a conventional SRAM. SRAM 1 comprises a memory cell array 30 having a plurality of memory cells MCs located at intersections of rows and columns. In the memory cell array 30, wordlines WL are provided to corresponding rows of memory cells and a pair of bitlines (BL, /BL) are provided to corresponding columns of memory cells. A target memory cell for reading and writing data is selected according to combinations of signal levels of address signals A0–An.

The SRAM 1 further comprises control logic 50 for controlling read/write operations of the SRAM 1 according to externally inputted signals, i.e., an external chip select signal /XCS, a write enable signal /WE, a read enable signal /RE, or other control signals (not shown). The control logic 50 generates an internal chip select signal /CS for activating an address input buffer 10 in response to the external chip select signal /XCS.

The address input buffer 10 is activated in response to the internal chip select signal /CS, receives the address signals A0–An from an address input terminal (not shown), and transfers internal address signals IA0–IAn to an address decoder 20 and the control logic 50.

The address decoder 20 comprises a row decoder 20 and a column, decoder 22. The row decoder 21 receives a part of address signals IA0–IAn from the address input buffer 10, and activates a wordline corresponding to inputted address signals. The column decoder 22 connects a pair of bitlines corresponding to all the other address signals excluding the address signals inputted to the row decoder 21, to a sense amplify & write driver 40.

In response to control signals PSA and PEQ from the control logic 50, the sense amplify & write driver 40 writes/reads data to/from a memory cell that is coupled to a bitline corresponding to address signals from the column decoder 22.

A data input/output buffer 60 is coupled to the sense amplify & write driver 40 through a pair of data input/output lines (IO, /IO). The input/output buffer 60 transfers data between a data input/output terminal (not shown) and the sense amplify & write driver 40. Data inputted from the data input/output terminal through a data bus, is transferred to the sense amplify & write driver 40 through the input/output buffer 60 and a pair of data input/output lines IO, /IO. Data read-out from the sense amplify & write driver 40 is outputted to the data input/output terminal through the pair of input/output lines IO and /IO, the data input/output buffer 60, and the data bus 70.

The control logic 50 receives the address signals IA0–IAn from the address input buffer 10, and outputs pulse signals PWL, PSA, PEQ, and MMX, which are needed to perform a write/read operation when the address signals IA0–IAn transition. For example, the pulse signal PWL is a signal for enabling the row decoder 21, the pulse signal PSA is a signal for driving the sense amplify & write driver 40, the pulse signal PEQ is a signal for equalizing the sense amplify & write driver 40, and the pulse signal PMX is a signal for driving the data input/output buffer 60.

FIG. 2 illustrates an architecture of the control logic 50 of the SRAM 1 shown in FIG. 1. The control logic 50 comprises a chip select buffer 51, a short pulse generation circuit 52, an address transition detect (ATD) circuit 53, and a pulse generation circuit 54. The chip select buffer 51 generates an internal chip select signal /CS for activating the address buffer 10, and a control signal /CSATD for activating the address transition detect circuit 53 in response to an external chip select signal /XCS. The short pulse generation circuit 52 receives the address signals IA0–IAn from the address input buffer 10 to generate short pulse signals SP0–SPn when the address signals IA0–IAn transition. The address transition detect circuit 53 summates the short pulse signals SP0–SPn from the short pulse generation circuit 52 to generate an address transition detect signal ATD in response to the control signal /CSATD. The pulse generation circuit 54 generates a series of pulse signals PWL, PSA, PEQ, and PMX, which are needed to start a write/read operation in response to the address transition detect signal ATD.

FIG. 3 illustrates an architecture of the chip select buffer 51. The chip select buffer 51 comprises a NOR gate 101, inverters 102–104, a delay unit 105, and a NAND gate 106.

The NOR gate 101 has input terminals and an output terminal. The input terminals receive the external chip select signal /XCS and a signal of a ground voltage level (i.e., logic "0"). The inverters 102–104 are sequentially coupled between the output terminal of the NOR gate and a chip select output terminal /CS in cascade. Therefore, when the external chip select signal /XCS transitions from high to low, the internal chip select signal /CS becomes active at a high level.

The delay unit 105 delays an output signal from the output terminal of the NOR gate 101 by a predetermined time. The NAND gate 106 has input terminals and an output terminal. The input terminals of the NAND gate 106 receive an output signal from the output terminal of the NOR gate 101 and a signal delayed by the delay unit 105. The output terminal of the NAND gate 106 outputs a control signal /CSATD for controlling the address transition detect circuit 53. Thus, if the external chip select signal /XCS is maintained in low level for a longer time than a delay time of the delay unit 105, the control signal /CSATD becomes active at the high level.

FIG. 4 illustrates architectures of the address input buffer 10 and the short pulse generation circuit 52. The address input buffer 10 comprises NOR gates 110–112 each corresponding to their externally inputted address signals A0–An. Each of the NOR gates 110–112 receives the internal chip select signal /CS and a corresponding address signal to carry out a NOR operation.

FIG. 5 illustrates an architecture of the address transition detect circuit 53 shown in FIG. 2. The address transition detect circuit 53 comprises a PMOS transistor 131, inverters 132, 134, and 138, a latch 140, a NOR gate 133, an NMOS transistor 137, and N of NMOS transistors 150–152. The PMOS transistor 131 has a current path formed between a power supply voltage and a first node N1 with a control gate. The latch 140 comprises inverters 135 and 136, and has one end coupled to the first node and the other end. The inverter 134 has an input terminal coupled to the other end of the latch 140 and an output terminal. The NOR gate 133 has input terminals for receiving the control signal /CSATD and an output terminal. The inverter 132 has an input terminal coupled to the output terminal of the NOR gate 133 and an output terminal coupled to the control gate of the PMOS transistor 131. The NMOS transistor 137 has a current path between the first node N1 and a ground voltage with a control gate controlled by the control signal /CSATD. Each of the NMOS transistors 150–152 has a current path formed between the first node N1 and the ground voltage with a gate controlled by a corresponding one of signals SP0–SPn outputted from the signal pulse generation circuit 52. The inverter 138 has an input terminal coupled to the first node N1 and an output terminal for outputting an address transition detect signal ATD.

The address transition detect circuit 53 detects whether an address transitions or not, by performing an OR operation for the signals SP0–SPn from the short pulse generation circuit 52 when the control signal /CSATD is active at a low level. Specifically, when at least one of the signals SP0–SPn from the short pulse generation circuit 52 is in a high level, among the NMOS transistors 150–152, an NMOS transistor corresponding to the signal of the high level is turned on. Thus, the address transition detect signal ATD becomes high. On the other hand, when the short pulse signals SP0–SPn from the short pulse generation circuit 52 are low, the NMOS transistors 150–152 are turned off. When the control signal /CSATD is inactive at the high level, the NMOS transistor 137 is turned on so that the first node becomes low and thus the address transition detect signal ATD is high.

FIG. 6A illustrates operation timings of the control signals shown in FIG. 2 during an address access time $t_{AA}$, that is counted from the time when an address signal transitions to the time when valid data is loaded on a data bus 70.

Referring to FIG. 2 and FIG. 6A, when the external chip select signal /XCS is maintained in an active state of a low level, the chip select signal /CS and the control signal /CSATD outputted from the chip select buffer 51 are maintained in the active state of the low level, respectively. If one IAi of the address signals IA0–IAn from the address input buffer 10 transitions, the short pulse generation circuit 52 outputs as a short pulse signal a signal SPi corresponding to the transitioned address signal Iai.

If at least one of the output signals SP0–SPn from the short pulse is the short pulse signal of the high level, the address transition detect circuit 53 outputs an address transition detect signal ATD having the same shape as that of the short pulse signal SPi. The pulse generation circuit 54 generates a series of pulse signals PWL, PSA, PEQ, and PMX when the address transition detect signal ATD transitions from high to low. The decoder 20 and the sense amplify & write driver 40 carry out a write/read operation in response to the series of the pulse signals PWL, PSA, PEQ, and PMX, which are generated from the pulse generation circuit 54. Among the pulse signals, only the pulse signal PWL is exemplarily illustrated in FIG. 6A.

FIG. 6B illustrates operation timings of the control signals shown in FIG. 2 during a chip select output time (tco), which is counted from the time when the external chip select time /XCS transitions from the high to the low, to the time when valid data is loaded on the data bus 70.

Referring to FIG. 2 and FIG. 6B, as the external chip select signal /XCS becomes active from high to low, the chip select buffer 51 outputs a chip select signal /CS of a low level. The NOR gate 101 and the inverters 102–104 of the chip select buffer 51, shown in FIG. 3, cause a delay time t1, which is counted from the time when the external chip select signal /XCS transitions from high to low, to the time when the chip select signal /CS from the chip select buffer 71 transitions from high to low. Due to a delay time of the delay unit 105, the control signal /CSATD becomes active at the low a good while after activating the external chip select signal /XCS.

The address input buffer 10 receives externally inputted address signals A0–An in response to the chip select signal /CS. The short pulse generation circuit 52 outputs signals SP0–SPn according to the transition of address signals IA0–IAn outputted from the address input buffer 10. Further, the address transition detect circuit 53 does not output an address transition detect signal ATD of a low level until the control signal /CSATD is made active at the low and a short pulse signal SPi outputted from the address buffer 20 transitions from high to low. As a result, the address access time $t_{AA}$ is shorter than the chip select output time (tco), which is counted from the time when the external chip select signal /XCS becomes active at the low to the time when the valid data is loaded on the data bus 70 as the series of the pulse signals PWL, PSA, PEQ, and PMX are generated.

With respect to both the address access time $T_{AA}$ and the chip select output time (tco) in a design of the conventional SRAM 1, the address transition detect circuit 53 detects whether a short pulse signal exists among the signals SP0–SPn outputted from the short pulse generation circuit 52. Afterwards, if the address transition detect circuit 53 outputs the detect signal ATD, the pulse generation circuit 54 operates in response to the detect signal ATD.

Therefore, as previously mentioned, the chip select output time (tco) reflects the time t1 required for activating the internal chip select signal /CS to make the chip select buffer 51 activate the address input buffer 10 when the external chip select signal /XCS transitions from an inactive state to an active state. As a result, the chip select output time (tco) becomes longer than the address access time $t_{AA}$ by the time t1.

In a semiconductor memory device, the chip select output time (tco) is regulated to be equal to the address access time $t_{AA}$. As discussed above, however, the chip select output time (tco) is comparatively longer than the address access time $t_{AA}$. For the reasons, the short address access time $t_{AA}$ in a conventional semiconductor memory device should be increased to be equal to the chip select output time (tco). As a result, the whole access speed of the conventional semiconductor memory device is decreased and a new scheme has been required to improve the chip select output time (tco) for increasing the access speed.

SUMMARY OF THE INVENTION

The present invention is generally directed to an improved semiconductor memory device that produces a reduction in the total access time by shortening a chip select output time.

According to one embodiment of the invention, a semiconductor memory device, which inputs/outputs data in response to an external chip select signal and an address signal that are inputted through signal input terminals, comprises a memory cell array for storing data, a write/read circuit for writing/reading the data to/from the memory cell array, a first input circuit for transferring the address signal to the write/read circuit through the signal input terminal in response to a first control signal, and a control logic for detecting whether the address signal inputted to the first input circuit transitions to generate a series of pulse signals so that the write/read circuit writes/reads a data signal.

Preferably, the control logic comprises a second input circuit, a detect circuit, pulse enable control circuit, a pulse generation circuit. The second input circuit receives the external chip select signal, and activates the first control signal and a second control signal when the external chip select signal is active. The detect circuit outputs an address transition detect signal when the second control signal is active and the address signal, which is outputted to the first input circuit, transitions. The pulse enable control circuit activates a pulse enable signal in response to the address transition detect signal when the first control signal is active, and activates the pulse enable signal when the first control signal transitions from an inactive state to an active state. The pulse generation circuit generates a series of the pulse signals in response to the pulse enable signal.

In another aspect of the invention, the pulse enable control circuit comprises a control signal generation circuit for activating a third control signal when it is sensed that the first control signal transitions from an inactive state to an active state. The control signal generation circuit further generates a pulse enable signal for activating the pulse enable signal when the third control signal is active and for activating the pulse enable signal in response to the address transition detect signal when the third control signal is inactive. Preferably, the first control signal is logic "1" in the active state and is logic "0" in the inactive state.

In another aspect, the control signal generation circuit comprises a first inverter for receiving the first control signal, a first delay circuit for receiving and delaying for a first delay time an output signal from the first inverter, a second delay circuit for receiving and delaying for a second delay time an output signal from the first delay circuit, a second inverter for receiving an output signal from the second delay circuit, and a NAND gate for receiving output signals form the second inverter and the first delay circuit to output a third control signal.

In yet another aspect, the pulse enable circuit comprises a NAND gate for receiving the third control signal from the NAND gate of the control signal generation circuit and the address transition detect signal from the detect circuit, and an inverter for receiving an output signal from the NAND gate of the pulse enable signal and outputting the pulse enable signal.

In another aspect of the invention, the detect circuit comprises a short pulse generation circuit for generating a short pulse signal when the address signal inputted to the first input circuit transitions, and an address transition detect circuit for outputting the address transition detect signal when the second control signal is active and the short pulse signal is inputted from the short pulse generation circuit. When the address signal inputted to the first input circuit is plural, the detect circuit outputs the address transition detect signal when at least one of the plural address signals inputted to the first input circuit transitions.

According to another embodiment of the invention, a semiconductor memory device, which inputs/outputs data in response to an external chip select signal and an address signal that are inputted through signal input terminals, comprises a memory cell array for storing data, a write/read circuit for writing/reading the data to/from the memory cell array, a first input circuit for transferring the address signal inputted through the signal input terminal to the write/read circuit in response to a first control signal, and a control logic for detecting whether the address signal inputted to the first input circuit transitions to generate a series of pulse signals so that the write/read circuit writes/reads a data signal.

Preferably, the control logic comprises a second input circuit for receiving the external chip select signal and outputting the first control signal and a second control signal in response to the external chip select signal, a short pulse generation circuit for generating a short pulse signal when the address signal inputted to the first input circuit transitions, and a pulse generating means for generating a series of pulse signals when the second control signal is active and the short pulse signal is inputted from the short pulse generation circuit and for generating the series of the pulse signals when the second control signal transitions form an inactive state to an active state.

In yet another aspect, the pulse generating means comprises a control signal generation circuit for activating a third control signal when it is sensed that the first control signal transitions from an inactive state to an active state, a chip select control circuit for outputting the short pulse signal from the short pulse generation circuit as a chip select short pulse signal when the third control signal is inactive and the short pulse signal is inputted from the short pulse generation circuit and for masking and then outputting an output signal from the short pulse generation circuit as the chip select short pulse signal, an address transition detect circuit for outputting the chip select short pulse signal from the chip select control circuit as the address transition detect signal in response to the second control signal, and a pulse generation circuit for generating the series of the pulse signals in response to the address transition detect signal.

These and other aspects, object, feature and advantages of the present invention will be described or become apparent from the following detailed description of preferred embodiments, which is to be read in connection with the accompanying drawings.

BRIEF DESCRIPTION OF THE DRAWINGS

FIG. 9A shows operation timings of control signals shown in FIG. 7 during an address access time ($t_{AA}$) counted from the time when an address signal transitions to the time when valid data is loaded on a data bus.

FIG. 9B shows operation timings of control signals shown in FIG. 7 during a chip select output time (tco) counted from the time when an external chip select circuit becomes active at a low to the time when valid data is loaded on a data bus.

DESCRIPTION OF PREFERRED EMBODIMENTS

Figure 7:
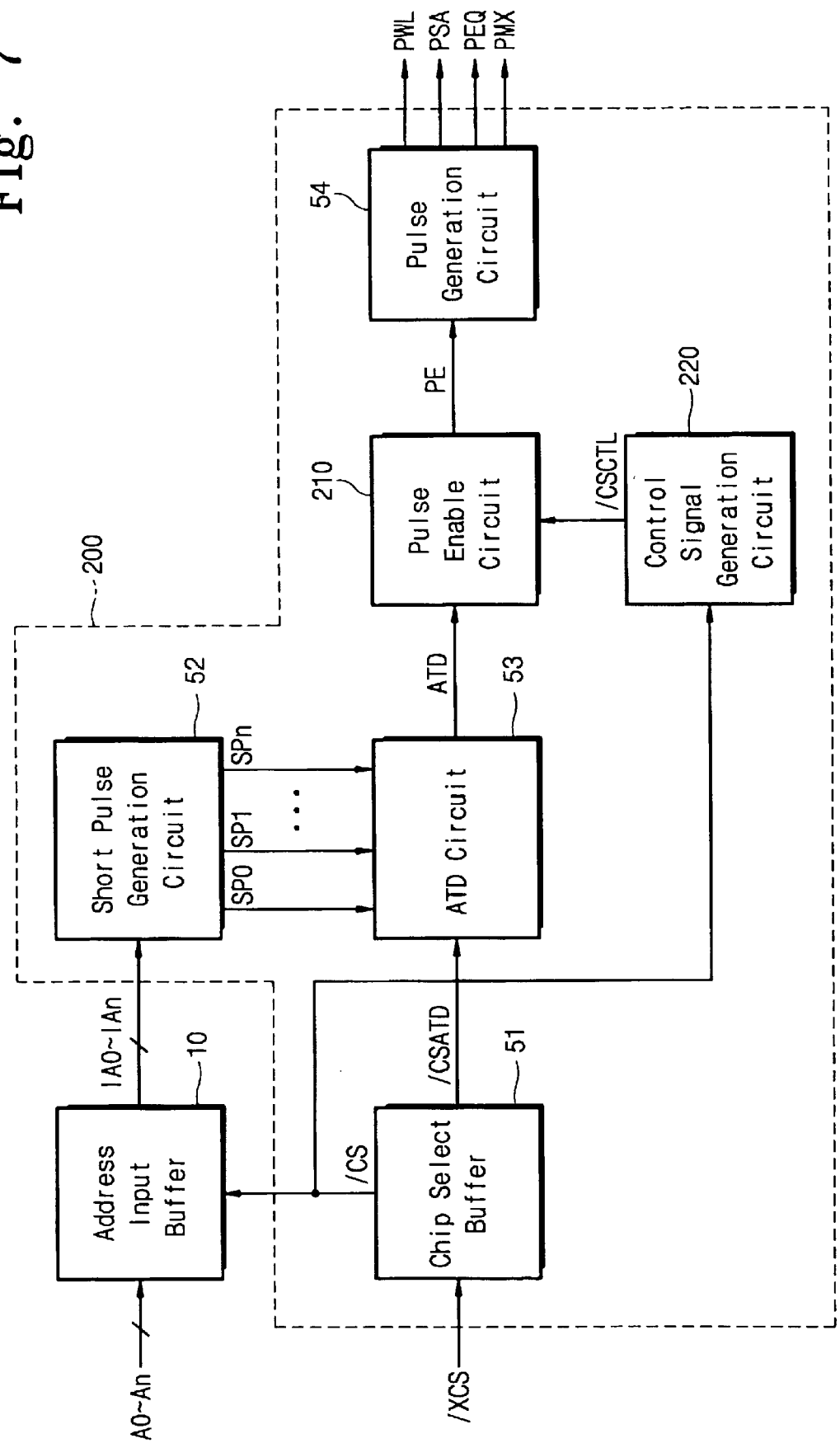
FIG. 7 shows a control logic circuit of a semiconductor memory device according to an embodiment of the present invention.

A circuit of a control logic for a semiconductor memory device according to an embodiment of the present invention is illustrated in FIG. 7. Referring now to FIG. 7, a control logic 200 comprises a chip select buffer 51, a short pulse generation circuit 52, an address transition detect circuit 53, a pulse generation circuit 54, a pulse enable circuit 210, and a control signal generation circuit 220.

Figure 1:
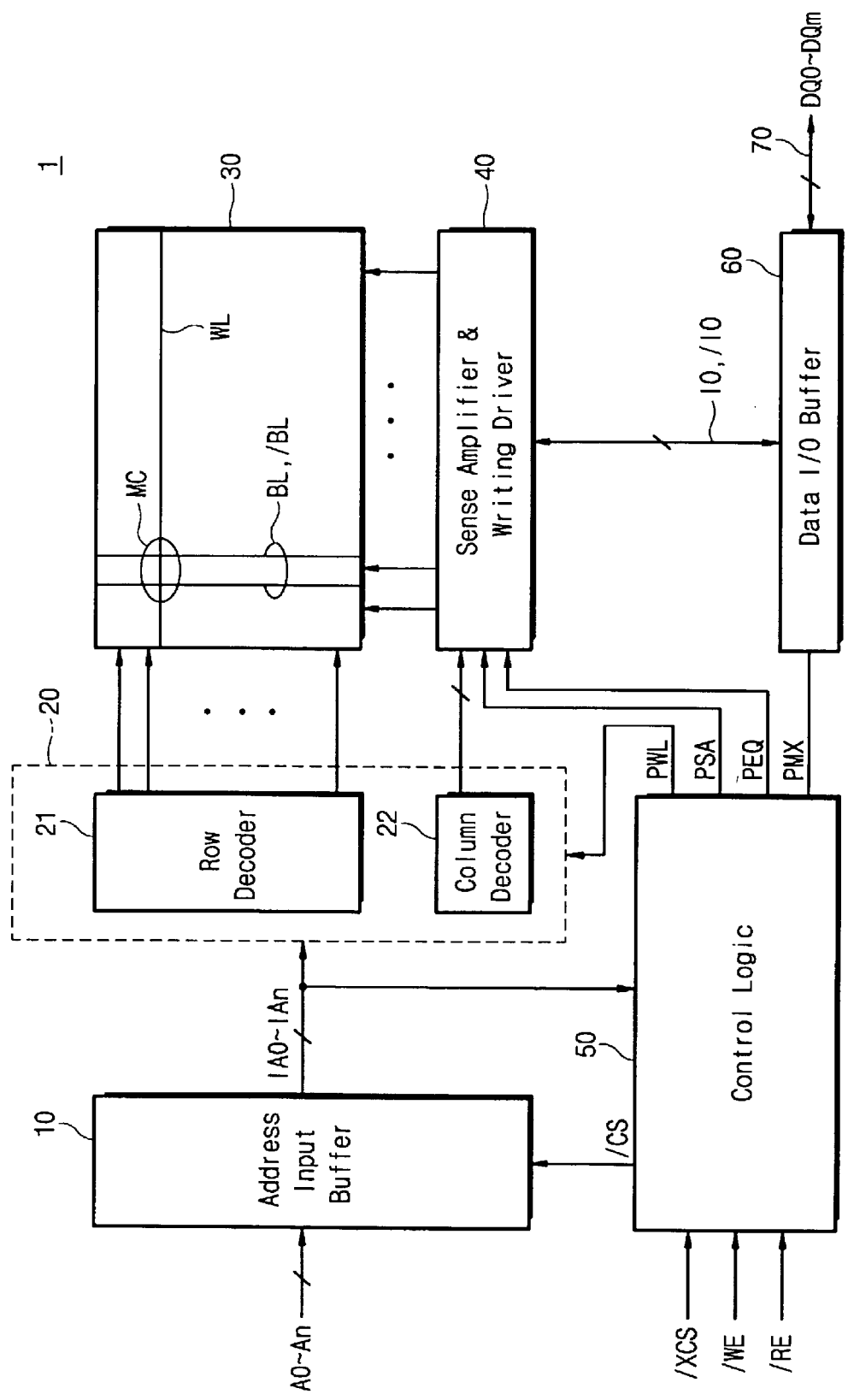
FIG. 1 shows a schematic diagram of a conventional SRAM.
Figure 2:
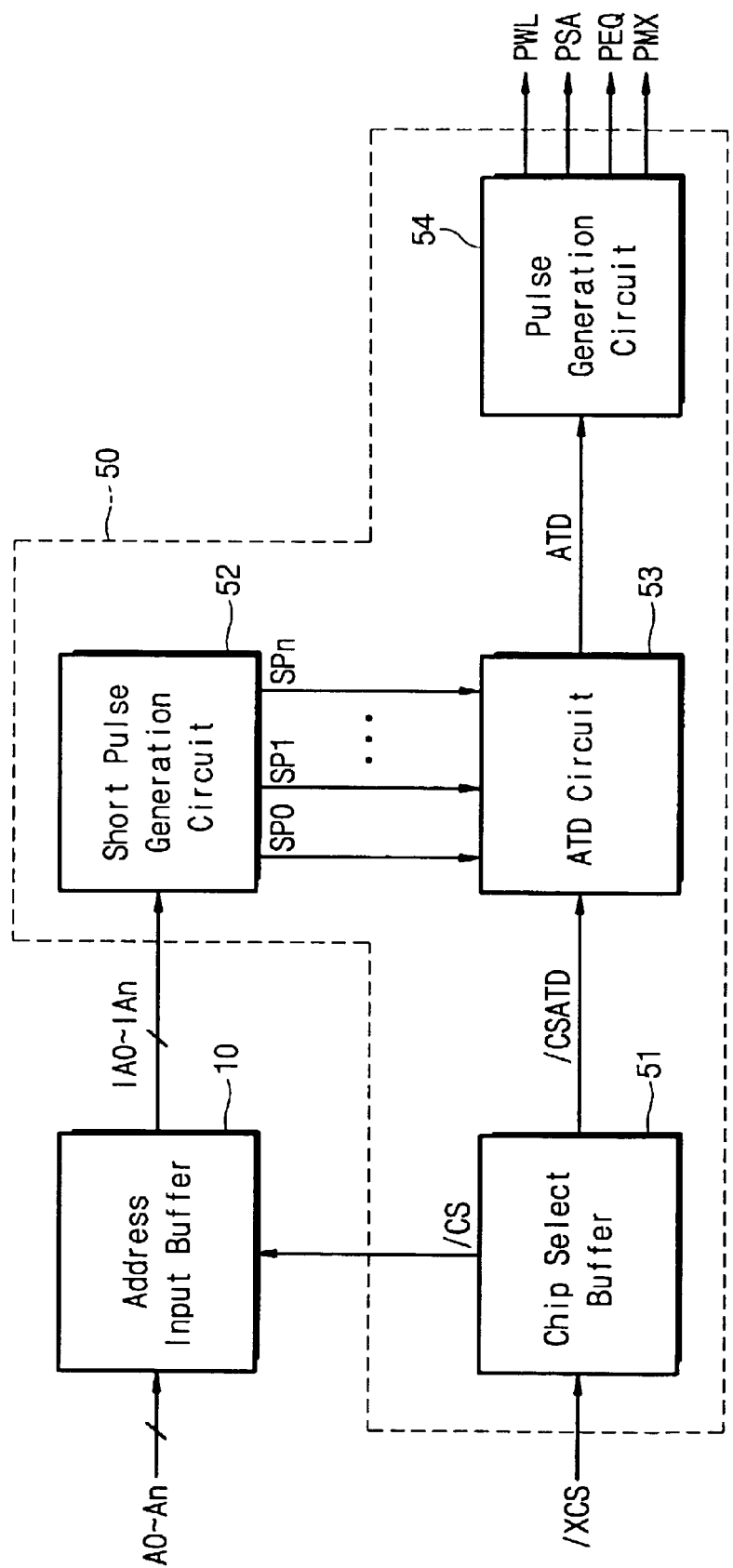
FIG. 2 shows a detailed circuit of a control logic in the SRAM shown in FIG. 1.
Figure 3:
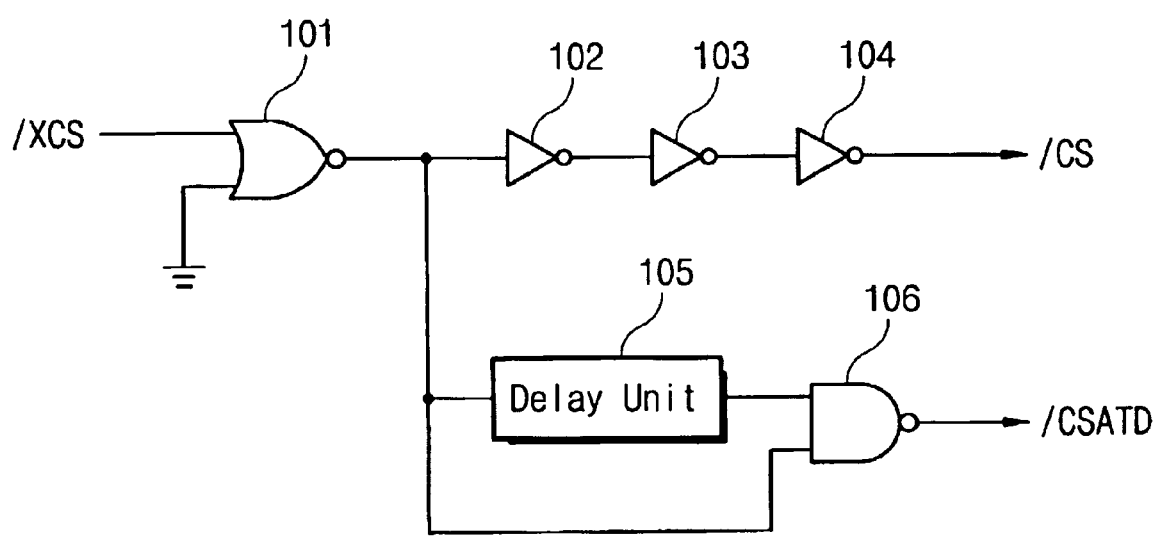
FIG. 3 shows a detailed circuit of a chip select buffer shown in FIG. 2.
Figure 4:
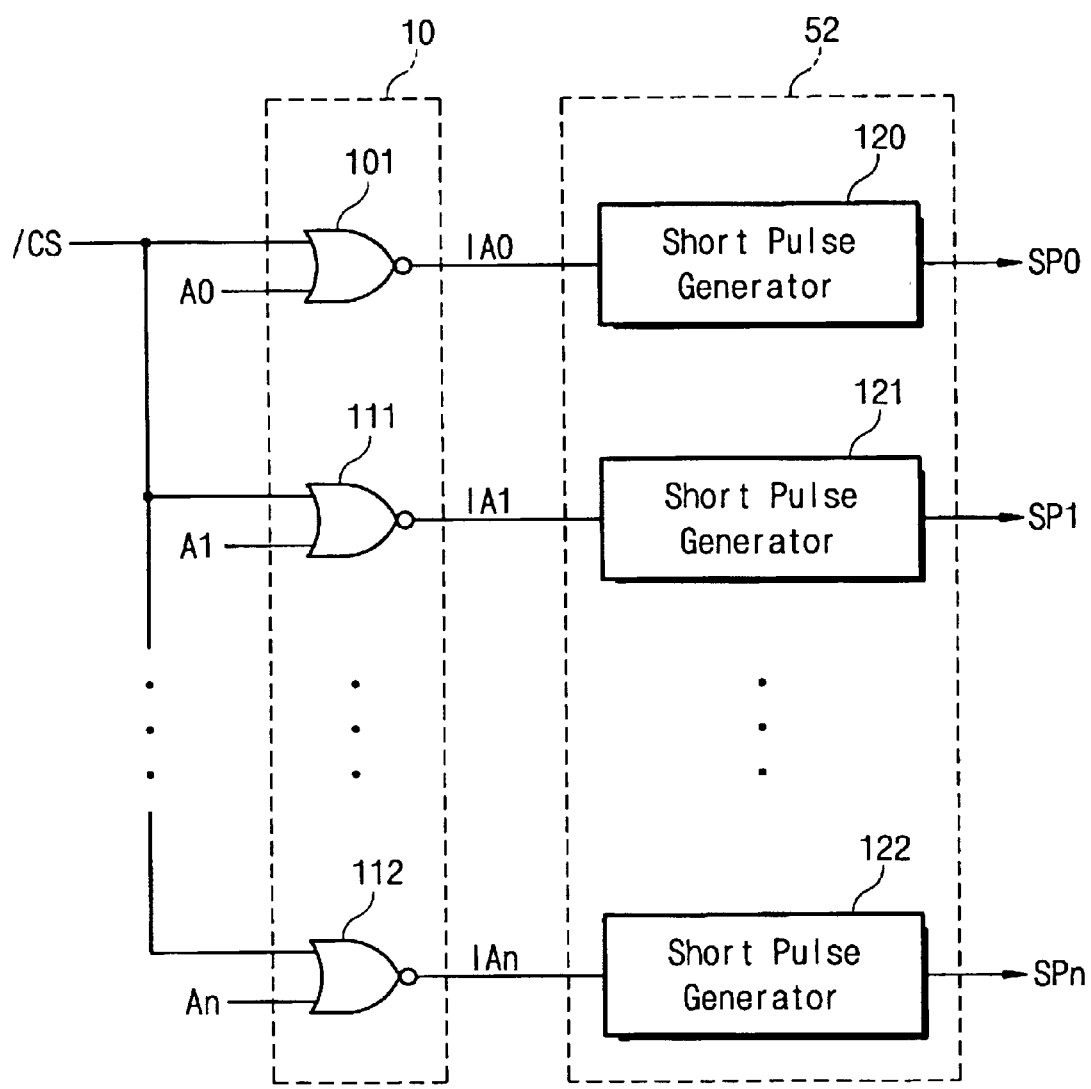
FIG. 4 shows a schematic diagram of an address input buffer and a short pulse generation circuit shown in FIG. 2.

The chip select buffer 51 is similar to the control logic 50 shown in FIG. 2, and generates an internal chip select signal /CS for activating an address input buffer 10 and a control signal /CSATD for activating an address transition detect circuit 120 in response to an external chip select signal /XCS. The short pulse generation circuit 52 generates short pulse signals SP0–SPn by sensing a transitioning address signal among address signals IA0–IAn from an address input buffer 10. The address transition detect circuit 53 summates short pulse signals SP0–SPn from the short pulse generation circuit 52 in response to a control signal /CSATD, and generates an address transition detect signal ATD.

The control signal generation circuit 220 generates a control signal /CSCTL in response to an internal chip select signal /CS generated from the chip select buffer 51. The pulse enable circuit 210 outputs a pulse enable signal PE in response to the address transition detect circuit ATD and the control signal /CSCTL from the control signal generation circuit 220. The pulse generation circuit 54 generates a series of pulse signals PWL, PSA, PEQ, and PMX, which are needed to start a write/read operation in response to the pulse enable signal PE from the pulse enable circuit 210.

Figure 8:
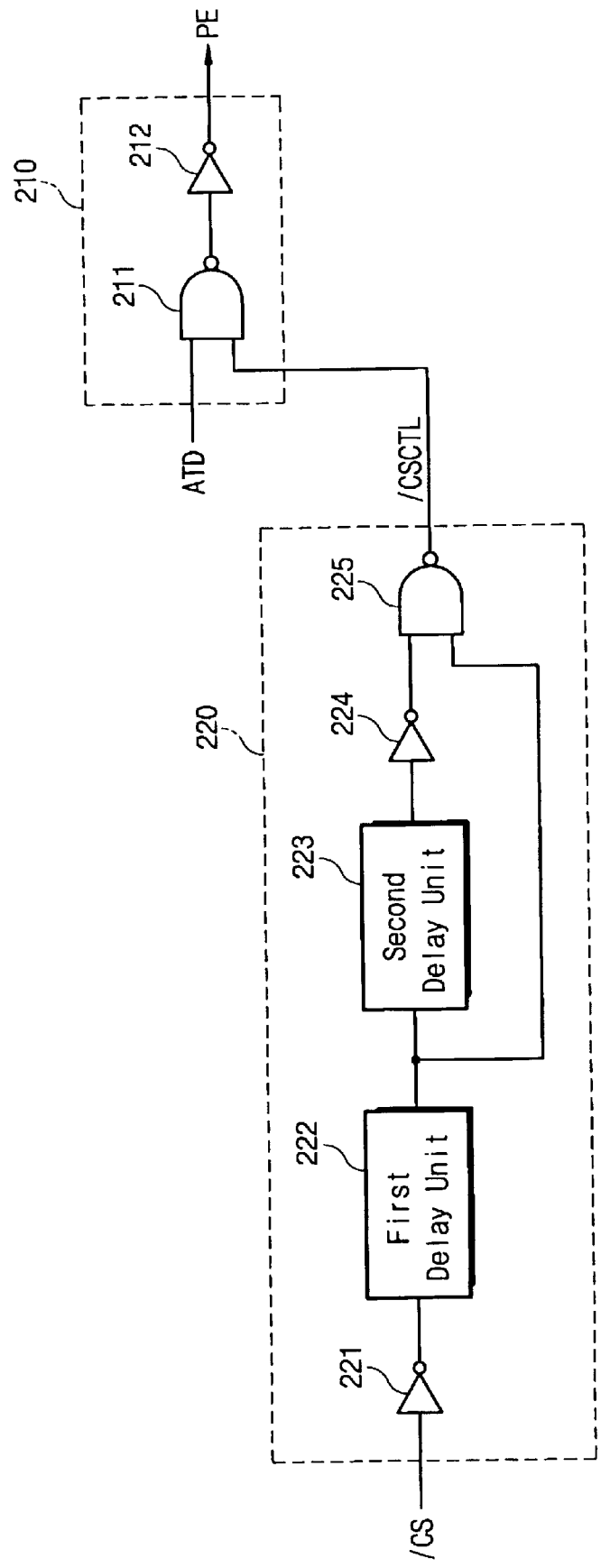
FIG. 8 shows a detailed diagram of a pulse enable circuit and a control signal generation circuit shown in FIG. 7, according to embodiments of the invention.

FIG. 8 illustrates embodiments of the pulse enable circuit 210 and the control signal generation circuit 220 shown in FIG. 7. In FIG. 8, the control signal generation circuit 220 comprises inverters 221 and 224, first and second delay units 222 and 223, and a NAND gate 225. The inverter 221 receives the internal chip select signal /CS. The first delay unit 222 receives and delays for a predetermined time an output signal from the inverter 221. The second delay unit 223 receives and delays for a predetermined time an output signal from the first delay unit 222. The inverter 224 receives from the second delay unit 223 and inverts an output signal. The NAND gate 225 receives output signals from the inverter 224 and the first delay unit 22 to perform a NAND operation.

The control signal generation circuit 220 outputs a control signal /CSCTL according to the internal chip select signal /CS. For example, when the internal chip select signal /CS is high (i.e., inactive), a signal outputted from the first delay unit 22 is made low after a delay time of the first delay unit 222. Therefore, the control signal /CSCTL outputted from the NAND gate 225 is high irrespective of level of an output signal from the inverter 224.

When the internal chip select signal /CS transitions from high to low (i.e., active), a signal outputted from the first delay unit 222 is made high after the delay time of the first delay unit 222. Before the delay time of the second delay unit 223 lapses after inputting a signal of a high level to the second delay unit 223, the output signal of the inverter 224 is maintained in a high level, which is a state where the internal chip select signal /CS is high. Thus, the control signal /CSCTL outputted from the NAND gate 225 is maintained in the high level before the delay time of the first delay unit 222 lapses after the internal chip select signal /CS turns from inactive to active. However, the control signal /CSCTL is made low before the delay time of the second delay unit 223 lapses after the delay time of the first delay unit 222 lapses. If both the delay time periods of the first and second delay units 222 and 223 lapse, the control signal /CSCTL returns to the active state.

The pulse enable circuit 210 comprises a NAND gate 211 and an inverter 212. The NAND gate 211 receives an address transition detect circuit signal ATD from the address transition detect circuit 53 and a control signal /CSCTL from the control signal generation circuit 220 to perform a NAND operation. The inverter 212 receives from the NAND gate 211 and inverts an output signal, and outputs a pulse enable signal PE.

When the control signal /CSCTL from the control signal generation circuit 220 is high, the pulse enable circuit 210 outputs the pulse enable signal PE in response to the address transition detect signal ATD from the address transition detect circuit 53. When the control signal /CSCTL transitions from high to low, the pulse enable circuit 210 outputs a pulse enable signal PE of a low level.

Operations of the control logic 200 according to an embodiment of the invention will be described in more detail with reference to FIG. 9A and FIG. 9B.

Referring to FIG. 7 and FIG. 9A, when the external chip select signal /XCS is maintained in an active state of a low level, the internal chip select signal /CS and the control signal /CSATD outputted from the chip select buffer 51 are maintained in an active state of a low level, respectively. In this case, when one IAi of the address signals IA0–IAn inputted from the address input buffer transitions, the short pulse generation circuit 52 outputs a signal SPi corresponding to the transitioning address as a short pulse signal of a high level. While a transition of only one of the address signals IA0–IAn has been exemplarily described in this embodiment, the pulse generation circuit 52 outputs short pulse signals each corresponding to their transitioning address signals when a plurality of address signals transition.

The address transition detect circuit 53 outputs an address transition detect signal ATD having the same short pulse shape as that of the short pulse signal SPi of the high level, if at least one of the output signal SP0–SPn from the short pulse generation circuit 52 is the short pulse signal of the high level. Since the internal chip select signal /CS is maintained in an active state of a low level, the control signal /CSCTL from the control signal generation circuit 220 is maintained in a high level. Thus, a pulse enable signal 210 outputs a pulse enable signal PE in response to the address transition detect signal ATD from the address transition detect circuit. The pulse generation circuit 54 generates a series of pulse signals PWL, PSA, PEQ, and PMX when the pulse enable signal PE from the pulse enable signal 210 transitions from high to low. A decoder 20, a sense amplify & write driver 40, and a data input/output buffer 60 carry out a write/read operation in response to the series of pulse signals PWL, PSA, PEQ, and PMX, which are generated from the pulse generation circuit 54. In FIG. 9A, only the pulse signal PWL is exemplarily illustrated.

As previously mentioned, the control logic 200 according to this embodiment operates in the same manner as the conventional control logic 50 shown in FIG. 2 when the external chip select signal /XCS remains active at the low level. However, when the external chip select signal /XCS becomes from inactive to active, the pulse generation circuit 54 of the control logic 200 generates a series of pulse signals PWL, PSA, PEQ, and PMX in response to the activation of the internal chip select signal /CS from the chip select buffer 51. As a result, a chip select output time (tco) of the semiconductor memory device is reduced.

Referring to FIG. 7 and FIG. 9B, when external chip select signal /XCS becomes active from high to low, the chip select buffer 51 sequentially activates the internal chip select signal /CS and the control signal /CSATD as a low level. In response to a high-to-low transition of the internal chip select signal /CS, the internal chip select signal /CS from the chip select buffer 51 continues to output a control signal /CSCTL of a low level from after a delay time of the first delay unit 222 lapses until before a delay time of the second delay unit 223 lapses. The pulse enable circuit 210 outputs a pulse enable signal PE in a low level, irrespective of an address transition detect signal ATD from the address transition detect circuit 53, as the control signal /CSCTL is made low. The pulse generation circuit 54 generates a series of pulse signals PWL, PSA, PEQ, and PMX when the pulse enable signal PE from the pulse enable circuit 210 transitions form high to low. A write/read operation is carried out in response to the series of the pulse signals PWL, PSA, PEQ, and PMX, which are generated from the pulse generation circuit 54. In FIG. 9B, only the pulse signal PWL is exemplarily illustrated.

According to the present invention, if the internal chip select signal /CS from the chip select buffer 51 is activated when the external chip select signal /XCS transitions from inactive to active, the pulse generation circuit 54 is enabled by the control signal generation circuit 222 and the pulse enable circuit 210 to generate the series of the pulse signals PWL, PSA, PEQ, and PMX. By controlling the delay time of the first delay unit 222, the chip select output time (tco) may be controlled. As a result, the chip select output time (tco) becomes identical to the address access time ($t_{AA}$).

When the external chip select signal /XCS transitions from an inactive state to an active state, a transition of address signals A0–An is belatedly detected after a pulse enable signal PE is made low. And, the pulse enable signal PE may be made high by the address transition detect signal ATD. To prevent this, a delay time of the second unit 223 is set such that a low-to-high transition of the control signal /CSCTL from the control signal generation circuit 220 lags behind a high-to-low transition of the address transition detect signal ATD.

Figure 10:
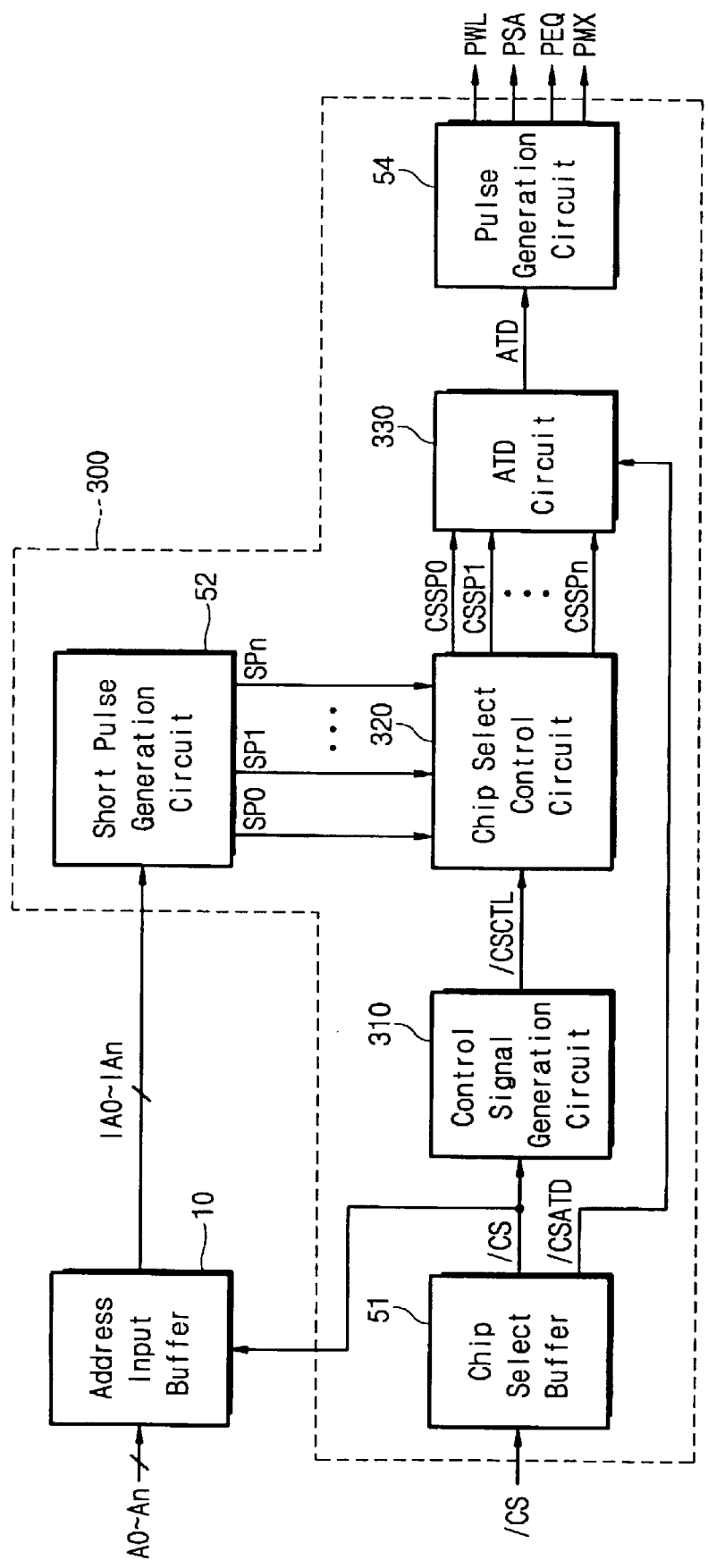
FIG. 10 shows a control logic circuit of a semiconductor memory device according to another embodiment of the present invention.

A control logic circuit of a semiconductor memory device according to another embodiment is illustrated in FIG. 10. A control logic 300 comprises a chip select buffer 51, a short pulse generation circuit 52, an address transition detect circuit 330, a pulse generation circuit 54, a control signal generation circuit 310, and a chip select control circuit 320.

The chip select buffer 51 is the same as in the control logic 50 of FIG. 2, and generates an internal chip select signal /CS for activating an address input buffer 10 and a control signal /CSATD for activating an address transition detect circuit 120 in response to an external chip select signal /XCS. A short pulse generation circuit 52 senses a transitioning one of address signals IA0–IAn from the address input buffer 10 to generate short pulse signals SP0–SPn.

The control signal generation circuit 310 generates a control signal /CSCTL in response to the internal chip select signal /CS generated from the chip select buffer 51. The chip select control circuit 320 generates chip select short pulse signals CSSP0–CSSPn in response to the control signal /CSCTL from the control signal generation circuit 310 and the short pulse signals SP0–SPn from the short pulse generation circuit 52. The address transition detect circuit 330 generates an address transition detect signal ATD by summating chip select short pulse signals CSSP0–CSSPn from the chip select control circuit 52 in response to the control signal /CSATD from the chip select buffer 51. The pulse generation circuit 54 generates a series of pulse signals PWL, PSA, PEQ, and PMX in response to the address transition detect signal ATD from the address transition detect circuit 330.

Figure 11:
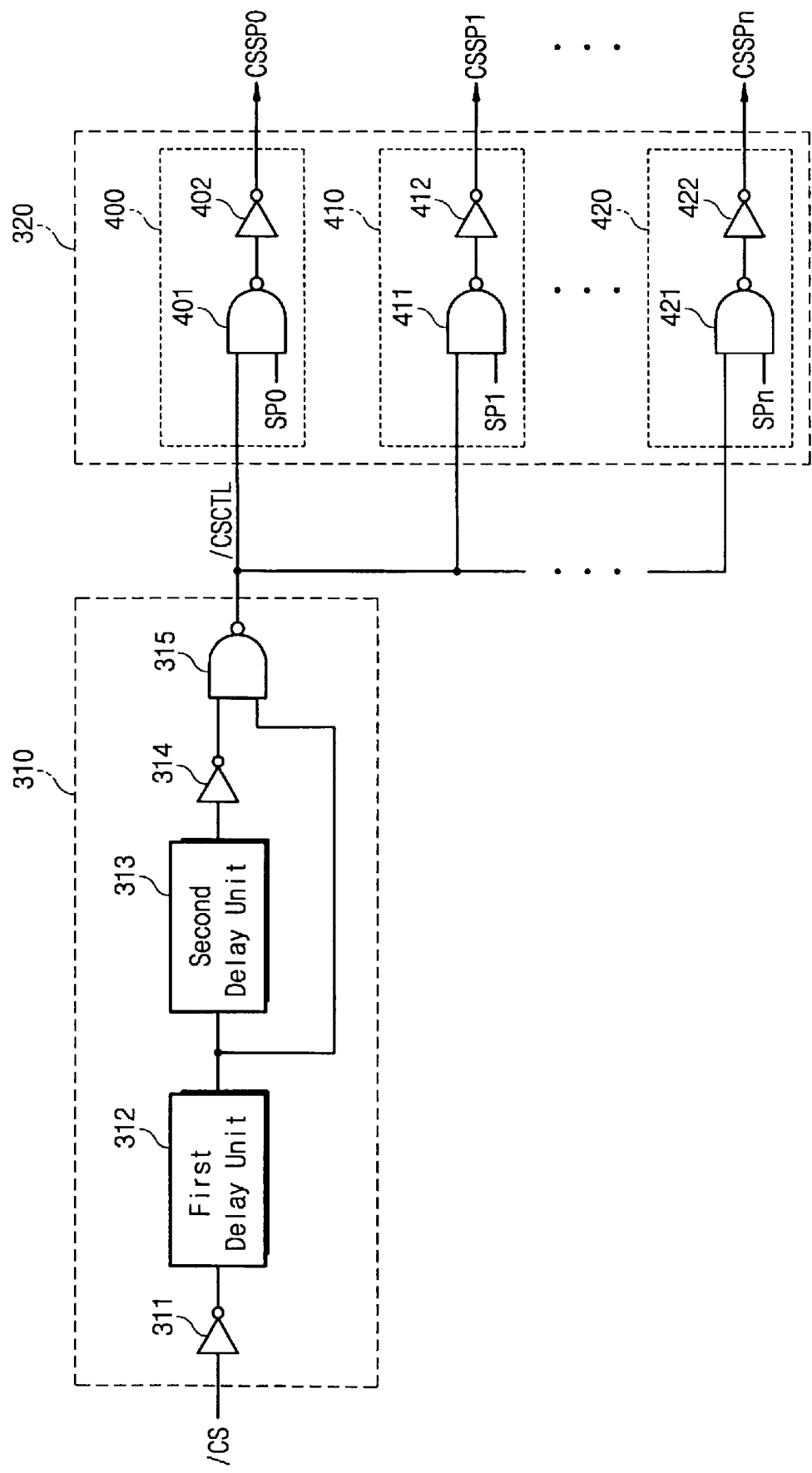
FIG. 11 shows a detailed diagram of a control signal generation circuit and a chip select control circuit shown in FIG. 10, according to other embodiments of the invention.

FIG. 11 illustrates embodiments of the control signal generation circuit 310 and the chip select control circuit 320 shown in FIG. 10. Similar to the control signal generation circuit 220 shown in FIG. 8, the control signal generation circuit 310 comprises inverters 311 and 314, first and second delay units 312 and 313, and a NAND gate 315. The inverter 311 receives the internal chip select signal /CS. The first delay unit is 312 receives and delays for a predetermined time an output signal from the inverter 311. The second delay unit 313 receives and delays for a predetermined time an output signal from the first delay unit 312. The inverter 314 receives and inverts an output signal from the second delay unit 313. The NAND gate 315 receives output signals from the inverter 314 and the first delay unit 312 to carry out a NAND operation.

The control signal generation circuit 310 outputs a control signal /CSCTL according to level of the internal chip select signal /CS. For example, when the internal chip select signal /CS is low (i.e., inactive), an output signal outputted from the first delay unit 312 is made low after a delay time of the first delay unit 312 lapses. Therefore, the control signal /CSCTL outputted from the NAND gate 315 is high irrespective of level of an output signal from the inverter 314.

When the internal chip select signal /CS transitions from high to low (i.e., active), a signal outputted from the first delay unit 312 becomes high after a delay time of the first delay unit 312 lapses. Before a delay time of the second delay unit 313 lapses after a signal of a high level outputted from the first delay unit 312 is inputted to the second delay unit 313, the output signal from the inverter 314 is maintained in a high level, which is a state where the internal chip select signal /CS is high. Thus, a control signal /CSCTL outputted from the NAND gate 315 is maintained in a high level before the delay time of the first delay unit 312 lapses after the internal chip select signal /CS transitions from the inactive state to the active state. Further, the control signal /CSCTL becomes low before the delay time of the second delay unit 313 lapses after the delay time of the first delay unit 312 lapses. The control signal /CSCTL returns to the high level after both the delay times of the first and second delay units 312 and 313 lapse.

The chip select control circuit 320 comprises logic circuits 400–420 each corresponding to their signals SP0–SPn from the short pulse generation circuit 52. Each of the logic circuits 400–420 is composed of an NAND gate and an inverter. Structures and operations of the logic circuits 400–420 are identical to one another, so that only the operation of the logic circuit 420 is described herein.

The NAND gate 401 receives a control signal /CSCTL from the control signal generation circuit 310 and a corresponding output signal SP0 from the short pulse generation circuit 52 to carry out a NAND operation. The inverter 322 receives an output signal of the NAND gate 321 to output a chip select short pulse signal CSSP0. Therefore, as the internal chip select signal /CS transition from high to low, the control logic 400 outputs a chip select short pulse signal CSSP0 of a low level irrespective of the output signal SP0 from the short pulse generation circuit 52 when the control signal /CSCTL from the control signal generation circuit 310 is low. That is, the control signal /CSCTL from the control signal generation circuit 310 fixes the chip select short pulse signal CSSP0 in a low level by masking the output signal SP0 from the short pulse generation circuit 52. On the other hand, when the control signal /CSCTL from the control signal generation circuit 310 is high, the control logic 400 outputs the chip select short pulse signal CSSP0 in response to the output signal SP0 from the short pulse generation circuit 52.

Figure 5:
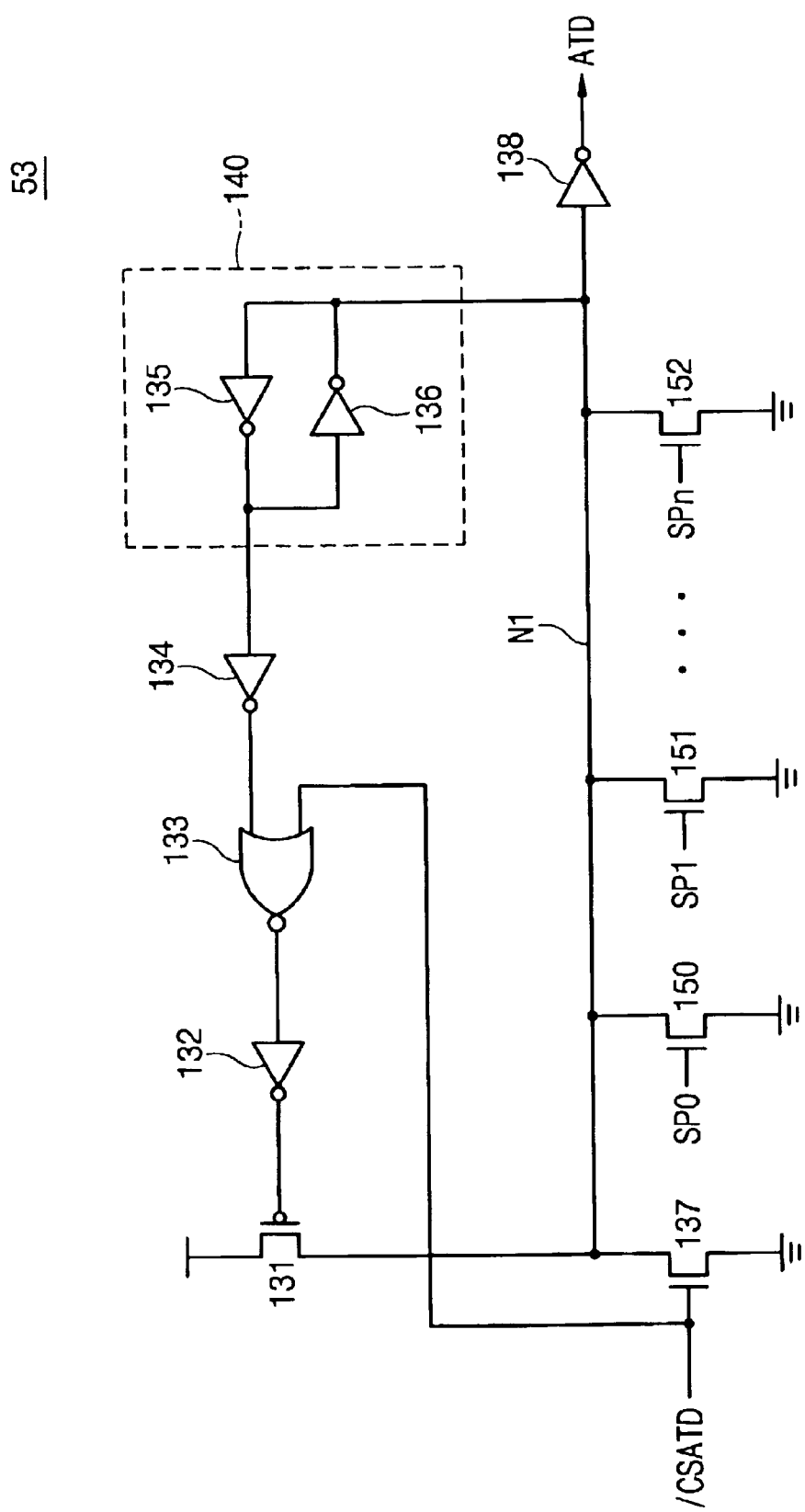
FIG. 5 shows a detailed diagram of an address transition detect circuit shown in FIG. 2.
Figure 6A:
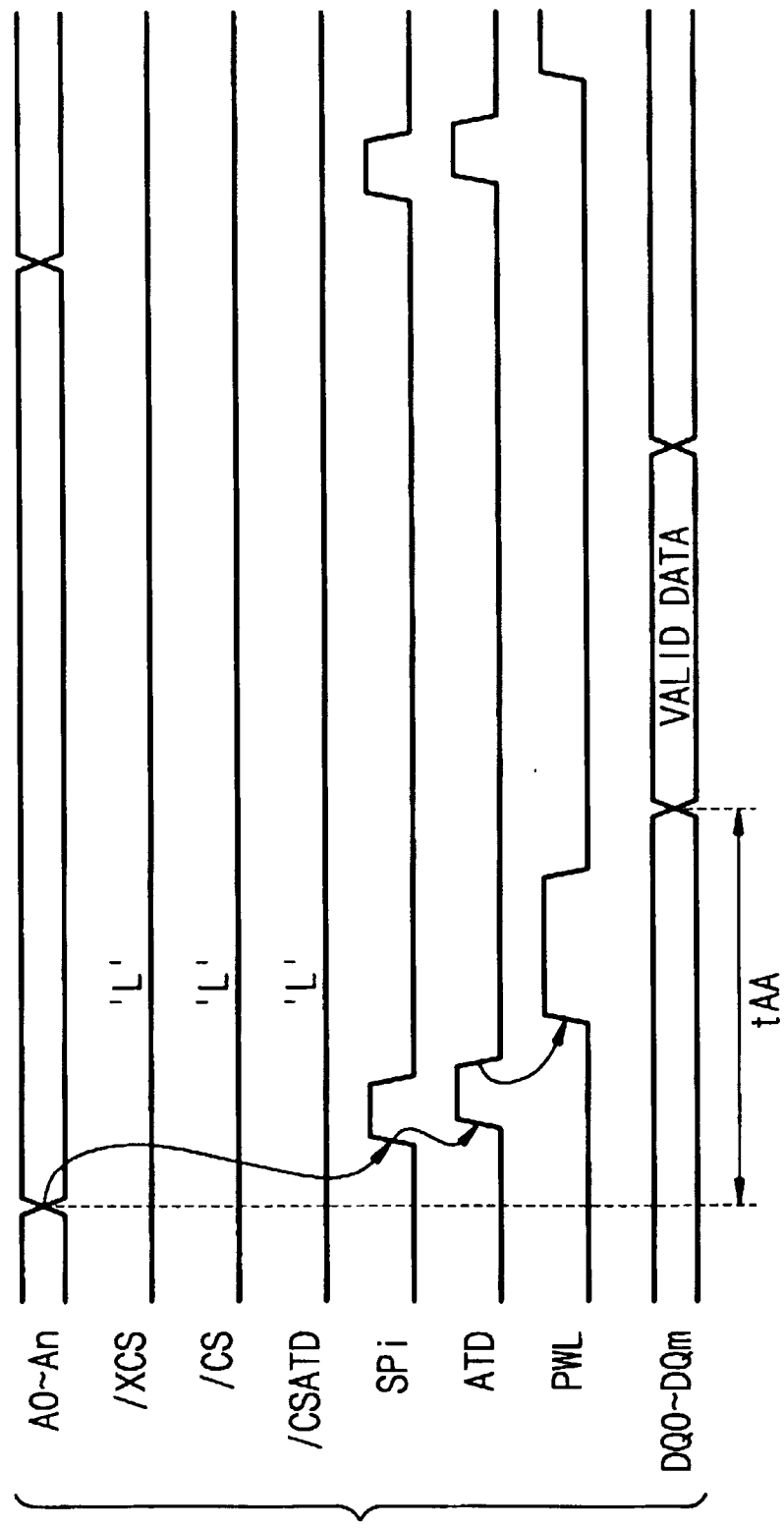
FIG. 6A shows operation timings of control signals shown in FIG. 2 during an address access time ($t_{AA}$) counted from the time when an address signal transitions to the time when valid data is loaded on a data bus.
Figure 6B:
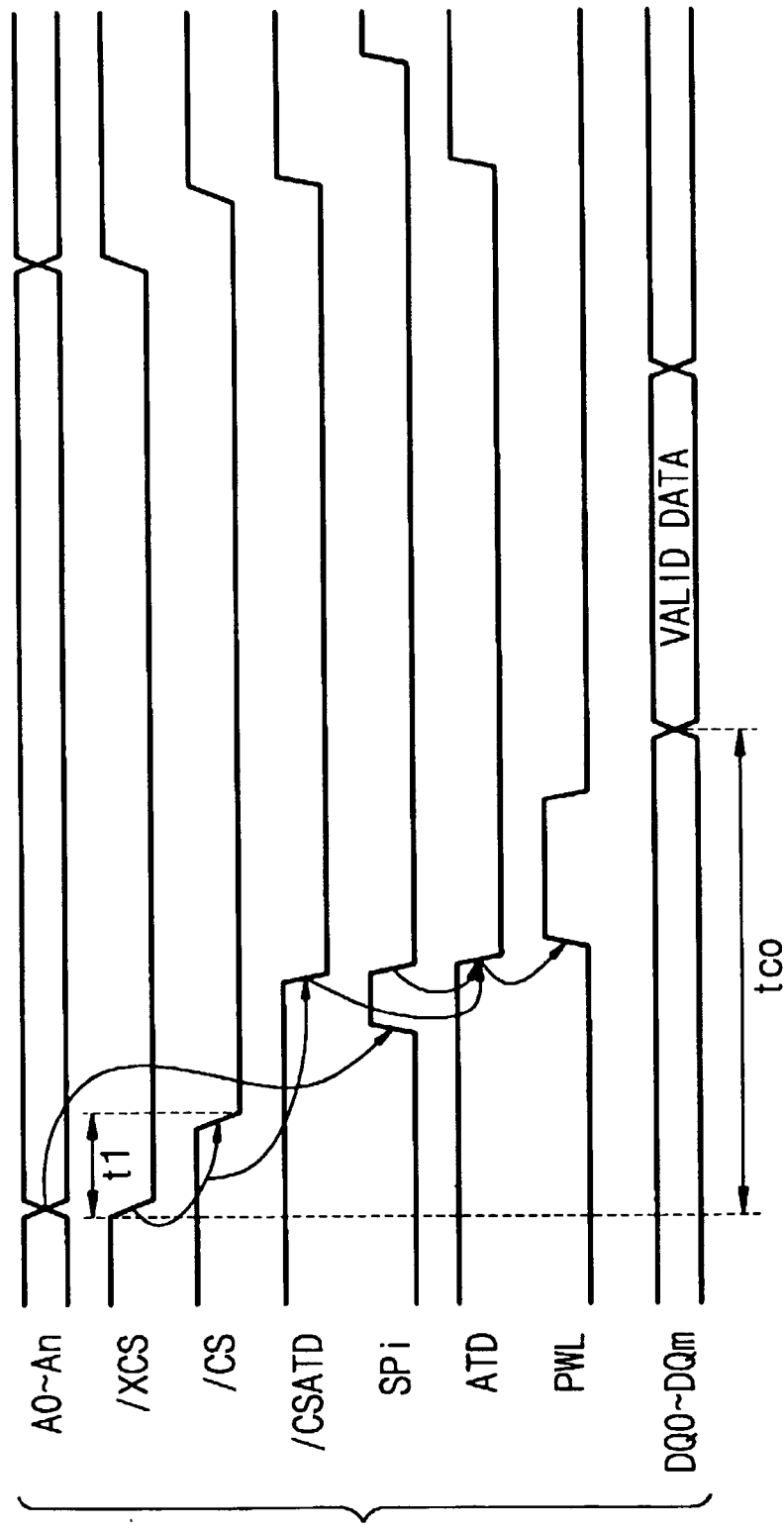
FIG. 6B shows operation timings of control signals shown in FIG. 2 during a chip select output time (tco) counted from the time when an external chip select signal transitions from high to low to the time when valid data is loaded on a data bus.
Figure 12:
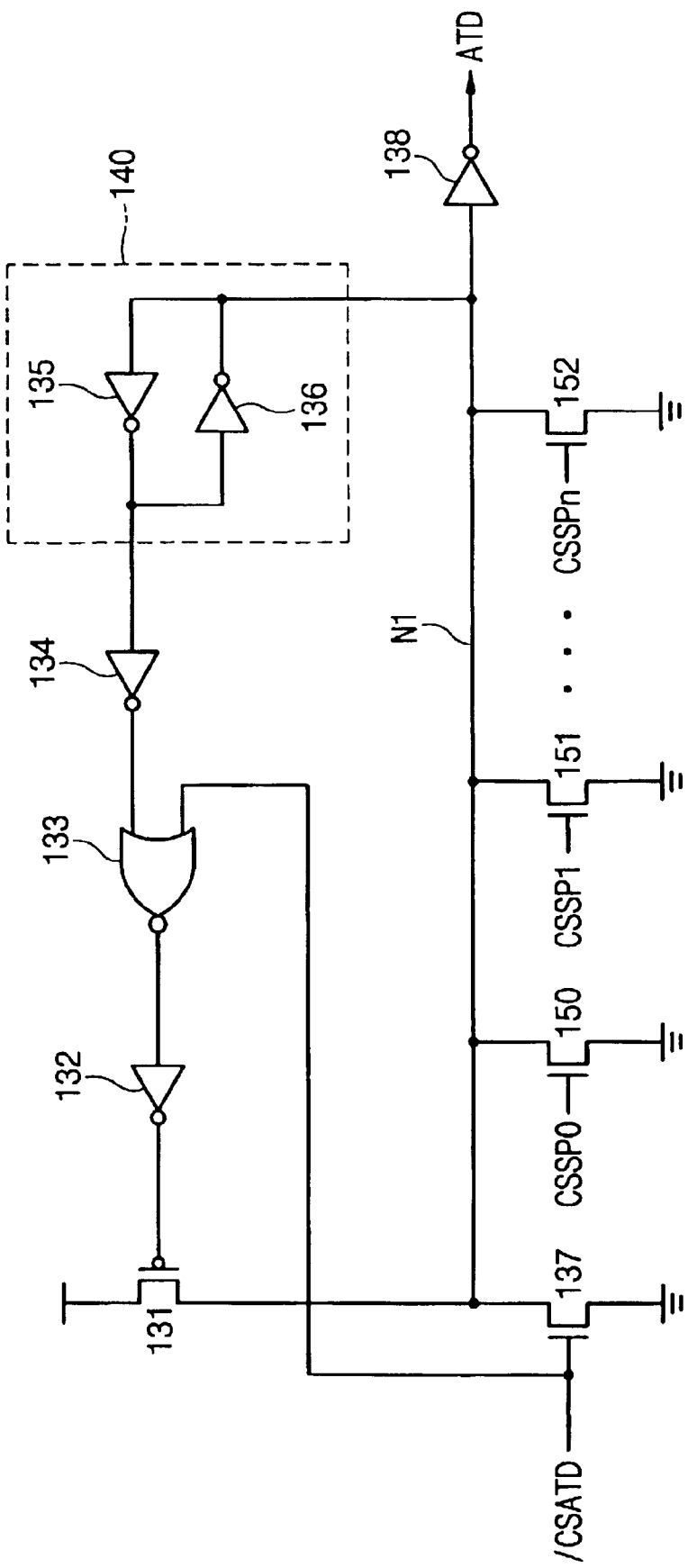
FIG. 12 shows a detailed diagram of an address transition detect circuit shown in FIG. 10, according to an embodiment of the invention.

The address transition detect circuit 330 shown in FIG. 10 is detailed in FIG. 12. The address transition detect circuit 330 is the same as the address transition detect circuit shown in FIG. 5. In the prior art, short pulse signals SP0–SPn from the short pulse generation circuit 52 are inputted to gates of the NMOS transistors 150–152. Meanwhile, in this embodiment, chip select short pulse signals CSSP0–CSSPn from a chip select control circuit 320 are inputted to gates of the NMOS transistors 150–152. Therefore, if at least one of the chip select short pulse signals CSSP0–CSSPn from the chip select control circuit 320 is the short pulse signal of the high level, the address transition detect circuit 330 outputs an address transition detect signal ATD when a control signal /CSATD from the chip select buffer 51 is low.

Now, operations of the control logic 300 according to another embodiment of the invention will be described in further detail with reference to FIG. 13A and FIG. 13B.

Figure 13A:
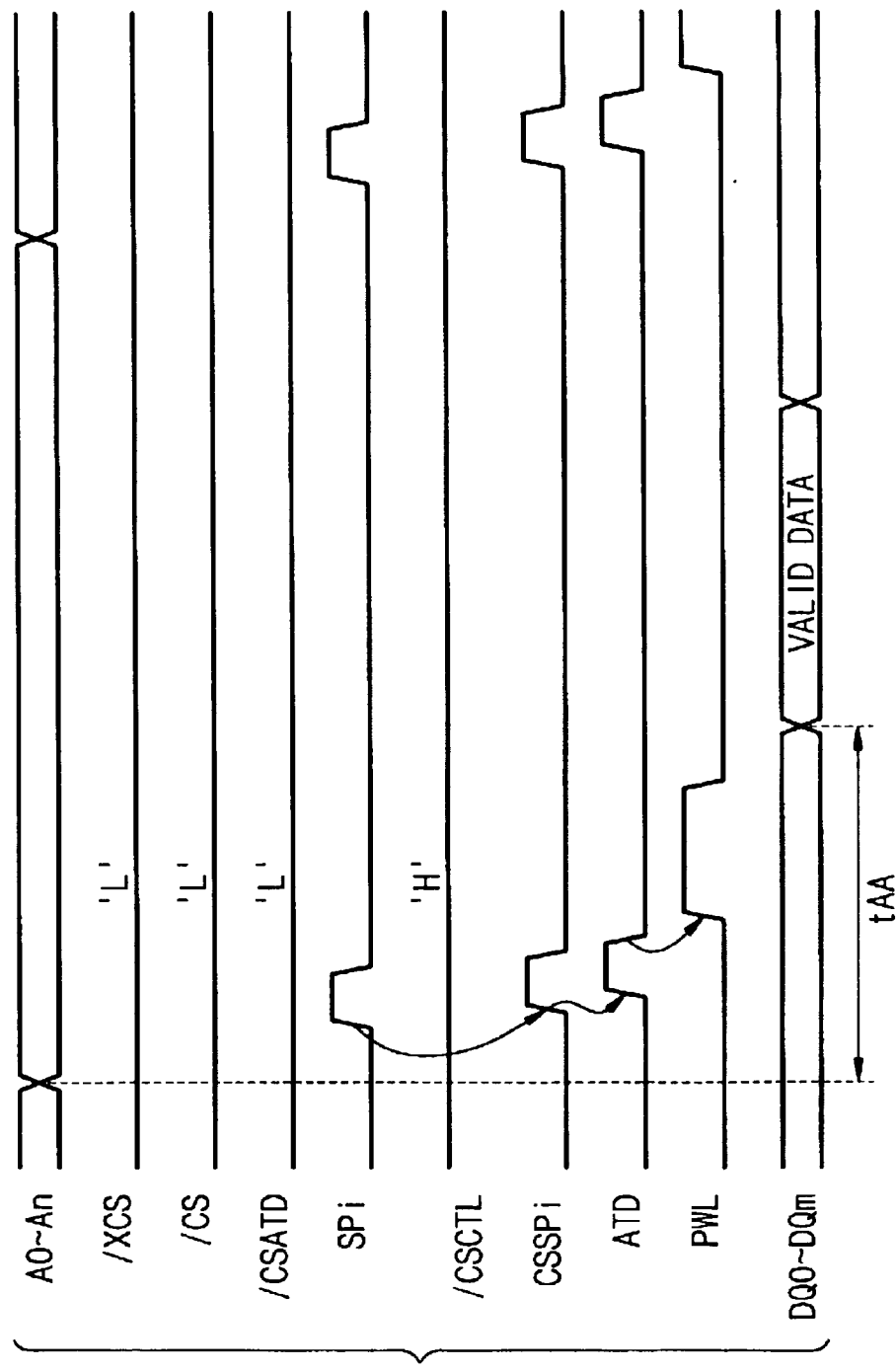
FIG. 13A shows operation timings of control signals shown in FIG. 10 during an address access time ($t_{AA}$) counted from the time when an address signal transitions to the time when valid data is loaded on a data bus.

Referring to FIG. 10 and FIG. 13A, when an external chip select signal /XCS is maintained in an active state of a high level, an internal chip select signal /CS and a control signal /CSATD outputted from a chip select buffer 51 are maintained in an active state of a low level, respectively. When one IAi or more address signals transition among address signals IA0–IAn inputted from an address input buffer, a short pulse generation circuit 52 outputs a signal SPi corresponding to a transitioned address signal Iai, as a short pulse signal of a high level. Since the internal chip select signal /CS is maintained in the active state of the low level, a control signal /CSCTL from a control signal generation circuit 310 is maintained in a high level. Thus, a chip select control circuit 320 outputs short pulse signals SP0–SPn from the short pulse generation circuit 52 as chip select short pulse signals CSSP0–CSSPn.

An address transition detect circuit 330 outputs an address transition detect signal ATD of a short pulse form in response to a control signal /CSATD of a low level when at least one of the chip select short pulse signals CSSP0–CSSPn from the chip select control circuit 320 is the short pulse signal of the high level. Accordingly, a pulse generation circuit 54 generates a series of pulse signals PWL, PSA, PEQ, and PMX when an address transition detect signal ATD from the address transition detect circuit 310 transitions from high to low. A decoder 20, a sense amplify & write driver 40, and a data input/output buffer 60 carry out a write/read operation in response to the series of the pulse signals PWL, PSA, PEQ, and PMX, which are generated from the pulse generation circuit 54. In FIG. 13A, only the pulse signal PWL is illustrated.

Figure 13B:
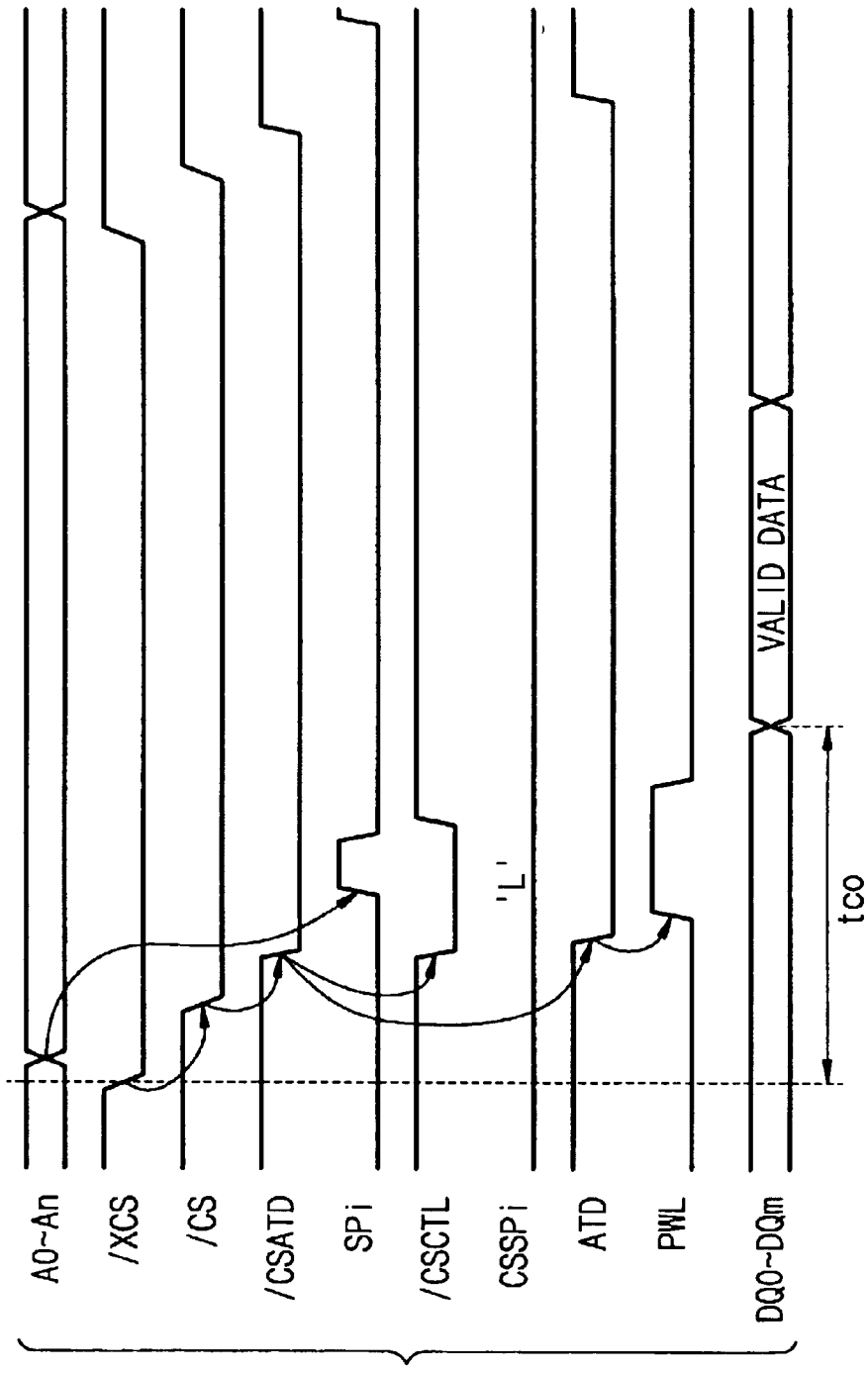
FIG. 13B shows operation timings of control signals shown in FIG. 10 during a chip select output time (tco) counted from the time when an external chip select signal becomes active from high to low to the time when valid data is loaded on a data bus.

Referring to FIG. 10 and FIG. 13B, when an external chip select signal /XCS becomes active from a high level to a low level, a chip select buffer 51 sequentially activates an internal chip select signal /CS and a control signal /CSATD in a low level. In response to a high-to-low transition of the internal chip select signal /CS from the chip select buffer 51, a control signal generation circuit 310 continues to output a control signal of a low level from after a delay time of a first delay unit 312 lapses until before the time when a delay time of a second delay unit 313 lapses. As the control signal /CSCTL from the control signal generation circuit 310 becomes low, a chip select control circuit 320 outputs chip select short pulse signals CSSP0–CSSPi in a low level irrespective of short pulse signals SP0–SPn from a short pulse generation circuit 52. An address transition detect circuit 330 outputs an address transition detect signal ATD of a low level because all the chip select short pulse signals CSSP0–CSSPi are low when the control signal /CSATD from the chip select buffer 51 transitions from high to low. A pulse generation circuit 54 generates a series of pulse signals PWL, PSA, PEQ, and PMX when the address transition detect signal ATD from the address transition detect circuit 330 transitions from high to low. A write/read operation is performed in response to the series of the pulse signals PWL, PSA, PEQ, and PMX, which are generated from the pulse generation circuit 54. In FIG. 13B, only the pulse signal PWL is illustrated.

As previously described, a control logic 300 according to this embodiment generates a series of pulse signals PWL, PSA, PEQ, and PMX in response to a transition of address signals A0–An when an external chip select signal /XCS is maintained in an active state (i.e., low level). However, when the external chip select signal /XCS transitions from an inactive state to an active state, a pulse generation circuit 54 is enabled by signals /CS and /CSATD outputted from a chip select buffer 51 to generate the series of the pulse signals PWL, PSA, PEQ, and PMX. According to the present invention, by controlling a delay time of a first delay unit 312, a chip select output time (tco) can be controlled. Therefore, the chip select output time is reduced to be equal to an address access time ($t_{AA}$).

To prevent a chip select short pulse signal CSSPi from becoming high when address signals A0–An belatedly transition after a pulse enable signal PE becomes low as an external chip select signal /XCS transition from an inactive state to an active state, a delay time of a second delay unit 313 is set so as to make a low-to-high transition of a control signal /CSCTL from a control signal generation circuit 310 lag behind a high-to-low transition of a short pulse signal SPi from a short pulse generation circuit 52.

It is to be understood that while embodiments of the invention have been described in conjunction with the detailed description thereof, the foregoing descriptions are intended to illustrate and not limit the scope of the invention, which is defined by the scope of the appended claims. Other aspects, advantages, and modifications are within the scope of the following claims.

What is claimed is:

1. A semiconductor memory device for inputting/outputting data in response to an external chip select signal and an address signal that are inputted through signal input terminals, the semiconductor memory device comprising:
    a memory cell array for storing data;
    a write/read circuit for writing/reading the data to/from the memory cell array;
    a first input circuit for transferring the address signal to the write/read circuit through the signal input terminal in response to a first control signal; and
    a control logic circuit for detecting whether the address signal inputted to the first input circuit transitions, and for generating a series of pulse signals so that the write/read circuit writes/reads a data signal,
    wherein the control logic circuit generates the series of pulse signals in response to the activation of an internal chip select signal from the first input circuit when the external chip select signal transitions from inactive to active, wherein the control logic circuit comprises:
        a second input circuit for receiving the external chip select signal and activating the first control signal and a second control signal when the external chip select signal is active;
        a detect circuit for detecting whether the address signal inputted to the first input circuit transitions while the second control signal is activated, and outputting an address transition detect signal;
        a pulse enable control circuit for activating a pulse enable signal in response to the address transition detect signal when the first control signal is active, and for activating the pulse enable signal when the first control signal transitions from an inactive state to an active state; and
        a pulse generation circuit for generating the series of the pulse signals in response to the pulse enable signal.

2. The semiconductor memory device of claim 1, wherein the pulse enable control circuit comprises:
    a control signal generation circuit for activating a third control signal when it is sensed that the first control signal transitions from an inactive state to an active state; and
    a pulse enable circuit for activating the pulse enable signal when the third control signal is active, and for activating the pulse enable signal in response to the address transition detect signal when the third control signal is inactive.

3. The semiconductor memory device of claim 2, wherein the first control signal is logic "1" in the active state and is logic "0" in the inactive state.

4. The semiconductor memory device of claim 3, wherein the control signal generation circuit comprises:
    a first inverter for receiving the first control signal;
    a first delay circuit for receiving and delaying during a first delay time an output signal from the first inverter;
    a second delay circuit for receiving and delaying for a second delay time an output signal from the first delay circuit;
    a second inverter for receiving an output signal from the second delay circuit; and
    a NAND gate for receiving output signals form the second inverter and the first delay circuit, and then for outputting a third control signal.

5. The semiconductor memory device of claim 4, wherein the pulse enable signal comprises:
    a NAND gate for receiving the third control signal from the NAND gate of the control signal generation circuit and the address transition detect signal from the detect circuit; and
    an inverter for receiving an output signal from the NAND gate of the pulse enable signal and outputting the pulse enable signal.

6. The semiconductor memory device of claim 1, wherein the deject circuit comprises:
    a short pulse generation circuit for a short pulse signal when the address signal inputted to the first input circuit transitions; and
    an address transition detect circuit for outputting the address transition detect signal when the second control signal is active and the short pulse signal is inputted from the short pulse generation circuit.

7. The semiconductor memory device of claim 1, wherein the address signal inputted to the first input circuit is plural.

8. The semiconductor memory device of claim 7, wherein the detect circuit outputs the address transition detect signal when at least one of the plural address signals inputted to the first input circuit transitions.

9. A semiconductor memory device for inputting/outputting data in response to an external chip select signal and an address signal that are inputted through signal input terminals, the semiconductor memory device comprising:
    a memory cell array for storing data;
    a write/read circuit for writing/reading the data to/from the memory cell array;
    a first input circuit for transferring the address signal inputted through the signal input terminal to the write/read circuit in response to a first control signal; and
    a control logic circuit for detecting whether the address signal inputted to the first input circuit transitions to generate a series of pulse signals so that the write/read circuit writes/reads a data signal,
    wherein the control logic circuit comprises:
        a second input circuit for receiving the external chip select signal and outputting the first control signal and a second control signal in response to the external chip select signal;
        a short pulse generation circuit for generating a short pulse signal when the address signal inputted to the first input circuit transitions; and
        pulse generating means for generating a series of pulse signals when the second control signal is active and the short pulse signal is inputted from the short pulse generation circuit, and for generating the series of the pulse signals when the second control signal transitions from an inactive state to an active state.

10. The semiconductor memory device of claim 9, wherein the second input circuit sequentially activates the first and second control signals with a constant interval in response to the external chip select signal.

11. The semiconductor memory device of claim 9, wherein the pulse generating means comprises:

a control signal generation circuit for activating a third control signal when it is sensed that the first control signal transitions from an inactive state to an active state;

a chip select control circuit for outputting the short pulse signal from the short pulse generation circuit as a chip select short pulse signal when the third control signal is inactive and the short pulse signal is inputted from the short pulse generation circuit, and for masking and then outputting an output signal from the short pulse generation circuit as the chip select short pulse signal when the third control signal is active;

an address transition detect circuit for outputting the chip select short pulse signal from the chip select control circuit as the address transition detect signal in response to the second control signal; and a pulse generation circuit for generating the series of the pulse signals in response to the address transition detect signal.

12. The semiconductor memory device of claim 11, wherein the first control signal is logic "1" in the active state and is logic "0" in the inactive state.

13. The semiconductor memory device of claim 12, wherein the control signal generation circuit comprises:

a first inverter for receiving the first control signal;

a first delay circuit for receiving and delaying during a first delay time an output signal from the first inverter;

a second delay circuit for receiving and delaying for a second delay time an output signal from the first delay circuit;

a second inverter for receiving an output signal from the second delay circuit; and a NAND gate for receiving output signals from the second inverter and the first delay circuit, and then for outputting a third control signal.

14. The semiconductor memory device of claim 13, wherein the address signal inputted to the first input circuit is plural.

15. The semiconductor memory device of claim 14, wherein the short pulse generation circuit comprises a plurality of short pulse generators each corresponding to the plural address signals inputted to the first input circuit, wherein each of the short pulse generators generates the short pulse signal when a state of a corresponding one of the plural address signals inputted to the first input circuit transitions.

16. The semiconductor memory device of claim 15, wherein the chip select control circuit comprises a plurality of logic circuits each corresponding to their plural short pulse generators, wherein each of the logic circuits comprises:

a second NAND gate for receiving a third control signal from the first NAND gate of the control signal generation circuit and the short pulse signal from a corresponding short pulse generator; and an inverter for receiving an output signal from the second NAND gate and outputting the chip select short pulse signal.

17. The semiconductor memory device of claim 16, wherein the address transition detect circuit outputs the address transition detect signal when at least one of the chip select short pulse signals from the chip select control circuit is a short pulse signal.

18. A method for inputting/outputting data in response to an externals chip select signal and an address signal that are inputted through signal input terminal of a semiconductor memory device, the method comprising the steps of:

storing data;

writing/reading the data to/from a memory cell array;

transferring the address signal inputted through a signal input terminal to a write/read circuit in response to a first control signal; and detecting whether the address signal inputted to a first input circuit transitions to generate a series of pulse signals so that the write/read circuit writes/reads a data signal.

19. The method of claim 18, wherein the step of detecting further comprises:

receiving the external chip select signal and outputting the first control signal and a second control signal in response to the external chip select signal;

generating a short pulse signal when the address signal inputted to the first input circuit transitions; and generating a series of pulse signals when the second control signal is active and the short pulse signal is inputted from a short pulse generation circuit, and when the second control signal transitions form an inactive state to an active state.

20. The method of claim 19, wherein the step of generating a series of pulse signals comprises:

activating a third control signal when it is sensed that the first control signal transitions from an inactive state to an active state;

outputting the short pulse signal from the short pulse generation circuit as a chip select short pulse signal when the third control signal is inactive and the short pulse signal is inputted from the short pulse generation circuit, and masking and then outputting an output signal from the short pulse generation circuit as the chip select short pulse signal when the third control signal is active;

outputting the chip select short pulse signal from the chip select control circuit as an address transition detect signal in response to the second control signal; and generating the series of the pulse signals in response to the address transition detect signal.

* * * * *